United States Patent
Chen

(10) Patent No.: US 8,937,510 B2
(45) Date of Patent: Jan. 20, 2015

(54) OPERATIONAL AMPLIFIER MODULE AND METHOD FOR ENHANCING DRIVING CAPABILITY OF OPERATIONAL AMPLIFIER CIRCUIT

(71) Applicant: Novatek Microelectronics Corp., Hsinchu (TW)

(72) Inventor: Ji-Ting Chen, Hsinchu County (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 13/727,622

(22) Filed: Dec. 27, 2012

(65) Prior Publication Data

US 2014/0085010 A1    Mar. 27, 2014

(30) Foreign Application Priority Data

Sep. 25, 2012   (TW) .................................. 101135147

(51) Int. Cl.
*H03F 3/68*    (2006.01)
*H03F 3/45*    (2006.01)
*H03M 1/00*    (2006.01)

(52) U.S. Cl.
CPC .............. *H03F 3/68* (2013.01); *H03F 3/45183* (2013.01); *H03M 1/00* (2013.01)
USPC .......................................... 330/311; 330/253

(58) Field of Classification Search
USPC .................................................. 330/252–261
See application file for complete search history.

(56) References Cited

U.S. PATENT DOCUMENTS 7,274,254 B2 *    9/2007    Hsieh .............................. 330/51

* cited by examiner

*Primary Examiner* — Hieu Nguyen
(74) *Attorney, Agent, or Firm* — Jianq Chyun IP Office

(57) ABSTRACT

An operational amplifier module including an operational amplifier circuit and a comparator circuit is provided. The operational amplifier circuit includes an input stage circuit and an output stage circuit. The input stage circuit receives an input signal. The output stage circuit is coupled to the input stage circuit for enhancing the driving capability of the input signal. The comparator circuit is coupled to the output stage circuit for receiving the input signal. The comparator circuit determines whether the input signal changes so as to output an enable control signal to the output stage circuit to enhance the driving capability of the operational amplifier circuit. Furthermore, a method for enhancing the driving capability of the foregoing operational amplifier circuit is also provided.

13 Claims, 3 Drawing Sheets

OPERATIONAL AMPLIFIER MODULE AND METHOD FOR ENHANCING DRIVING CAPABILITY OF OPERATIONAL AMPLIFIER CIRCUIT

CROSS-REFERENCE TO RELATED APPLICATION

This application claims the priority benefit of Taiwan application serial no. 101135147, filed on Sep. 25, 2012. The entirety of the above-mentioned patent application is hereby incorporated by reference herein and made a part of this specification.

BACKGROUND

1. Field of the Invention

The invention is directed to a load driving module and a method of enhancing driving capability thereof and more particularly directed to an operational amplifier module and a method of enhancing driving capability thereof.

2. Description of Related Art

In the related art, driving capability of an operational amplifier is controlled by an output stage circuit therein. The output stage circuit typically includes an output transistor. In order to enhance the driving capability of the operational amplifier, a method of increasing a width-to-length ratio of the output transistor to reduce an equivalent resistance thereof is adopted for enhancing the driving capability. in addition, from the perspective on the circuit layout, the aforementioned output transistor in practice is generally implemented by a layout manner utilizing multiple transistors. Thus, if the driving capability is to be enhanced by increasing the charging speed of the output transistor, the number of the transistors in the layout usually has to be increased.

However, increasing either the width-to-length ratio of the output transistor or the number of the transistors in the layout would additionally increase the area occupied by the transistors and is not cost-effective.

SUMMARY

The invention is directed to an operational amplifier module which enhances internal driving capability of an operational amplifier circuit therein by using a control signal.

The invention is directed to a method of enhancing driving capability of an operational amplifier circuit, which is applicable to the aforementioned operational amplifier module.

The invention is directed to an operational amplifier module, including an operational amplifier circuit and a comparator circuit. The operational amplifier circuit includes an input stage circuit and an output stage circuit. The input stage circuit is configured to receive an input signal. The output stage circuit is coupled to the input stage circuit and configured to enhance driving capability of the input signal. The comparator circuit is coupled to the output stage circuit and configured to receive the input signal and determines whether the input signal is changed to output a control signal to enable the output stage circuit to enhance the driving capability of the operational amplifier circuit.

In an embodiment of the invention, the output stage circuit includes a driving capability control circuit. The driving capability control circuit is coupled to the comparator circuit and controlled by the control signal. During the control signal being enabled, the driving capability control circuit enhances the driving capability of the operational amplifier circuit by using a specific voltage.

In an embodiment of the invention, the specific voltage is a system voltage or a ground voltage.

In an embodiment of the invention, the output stage circuit further includes a first output transistor. The driving capability control circuit includes a second output transistor and a switch module. The second output transistor and the first output transistor are connected in parallel. The switch module is coupled between the gate of the first output transistor and the gate of the second output transistor and controlled by the control signal. During the control signal being enabled, the switch module enhances the driving capability of the operational amplifier circuit by using the specific voltage.

In an embodiment of the invention, the switch module includes a first switch transistor and a second switch transistor. The first switch transistor is coupled between the gate of the first output transistor and the gate of the second output transistor and controlled by the control signal. The second switch transistor is coupled between the gate of the second output transistor and the specific voltage and controlled by the inverted control signal. When the first switch transistor is turned off, the second switch transistor is turned on so that the gate of the second output transistor is coupled to the specific voltage.

In an embodiment of the invention, the comparator circuit determines whether a voltage value or a current value of the input signal is changed. If yes, the comparator circuit outputs the control signal to enable the driving capability control circuit. If no, the comparator circuit outputs the control signal to disable the driving capability control circuit.

In an embodiment of the invention, the operational amplifier module further includes a digital-to-analog converter circuit. The digital-to-analog converter circuit is coupled to the operational amplifier circuit and the comparator circuit and configured to receive the input signal in digital format. Besides, the digital-to-analog converter circuit is configured to convert the input signal in digital format to the input signal in analog format and then, output the input signal in analog format to the operational amplifier circuit and the comparator circuit. The comparator circuit determines whether a most significant bit (MSB) of the input signal in digital format is changed. If yes, the comparator circuit outputs the control signal to enable the driving capability control circuit. If no, the comparator circuit outputs the control signal to disable the driving capability control circuit.

The invention is directed to a method of enhancing driving capability of the operational amplifier circuit. The operational amplifier circuit includes an output stage circuit. The method includes steps as follows. An input signal is received. Whether the input signal is changed is determined. If the input signal is changed, a control signal is outputted to enable the output stage circuit so as to enhance the driving capability of the operational amplifier circuit.

In an embodiment of the invention, the method further includes a step as follows. During the control signal being enabled, a specific voltage is used to enhance driving capability of the operational amplifier circuit.

In an embodiment of the invention, the method further includes the following step. If the input signal is not changed, the control signal is outputted to disable the output stage circuit.

In an embodiment of the invention, the specific voltage is a system voltage or a ground voltage.

In an embodiment of the invention, the step of determining whether the input signal is changed includes determining whether a voltage value or a current value of the input signal is changed.

In an embodiment of the invention, the step of determining whether the input signal is changed includes determining whether an MSB of the input signal is changed.

To sum up, in the exemplary embodiments of the invention, when the input signal is changed, the comparator circuit outputs the control signal to enable the output stage circuit and enhances the driving capability of the operational amplifier circuit by using the specific voltage.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
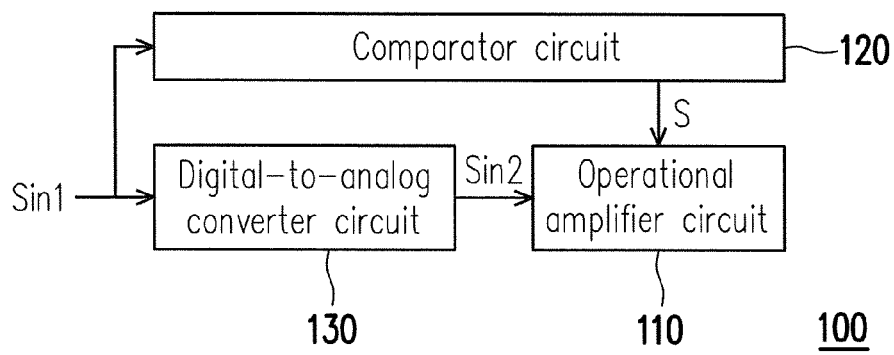
FIG. 1 is a schematic block diagram illustrating an operational amplifier module according to an embodiment of the invention.

FIG. 1 is a schematic block diagram illustrating an operational amplifier module according to an embodiment of the invention. With reference to FIG. 1, an operational amplifier module 100 of the present embodiment includes an operational amplifier circuit 110, a comparator circuit 120 and a digital-to-analog converter circuit 130. Particularly, in the present embodiment, the digital-to-analog converter circuit 130 is coupled to the operational amplifier circuit 110 and the comparator circuit 120 and configure to receive the input signal in digital format (hereinafter, the digital input signal Sin1). The digital-to-analog converter circuit 130 firstly converts the digital input signal Sin1 to the input signal in analog format (hereinafter, the analog input signal Sin2) and then, outputs the analog input signal Sin2 to the operational amplifier circuit 110.

In the present embodiment, the operational amplifier circuit 110 is configured to receive the analog input signal Sin2 provided from the digital-to-analog converter circuit 130 and enhance driving capability of the analog input signal Sin2. The comparator circuit 120 is coupled to the operational amplifier circuit 110 and the digital-to-analog converter circuit 130. The comparator circuit 120 is configured to receive the digital input signal Sin1 and determined whether the digital input signal Sin1 is changed so as to decide whether to output a control signal S to enable the operational amplifier circuit 110 to enhance the driving capability, which is also referred to as the enable control signal S.

Thus, the operational amplifier module 100 of the present embodiment can achieve enhancing the driving capability without increasing the width-to-length ratio of the output transistor or the number of the transistors in the layout. Thus, the area occupied by the operational amplifier circuit 110 on the chip can be saved.

In the present embodiment, the digital input signal Sin1 is illustrated as an example of the input signal received by the operational amplifier module 100. Thus, what are compared by the comparator circuit 120 are, for example, the most significant bits (MSBs) of the two sequential data of the input signal Sin1, which will be described in detail hereinafter. However, the invention is not limited thereto. In other embodiments, the comparator circuit 120 may also compare an analog signal directly outputted from a previous stage circuit to the operational amplifier circuit 110. At this time, the comparator circuit 120 determines whether a voltage value or a current value of the inputted analog signal is changed, for example, so as to decide whether to output the control signal S to enable the operational amplifier circuit 110. Under such implementation configuration, the operational amplifier module 100 does not have to include the digital-to-analog converter circuit 130, and the designer may decide whether to dispose the digital-to-analog converter circuit 130 according to actual requirements.

An exemplary embodiment where the comparator circuit 120 determines whether an MSB of the digital input signal Sin1 is changed so as to decide whether to enhance the driving capability of the operational amplifier circuit 110 will be described hereinafter.

Figure 2:
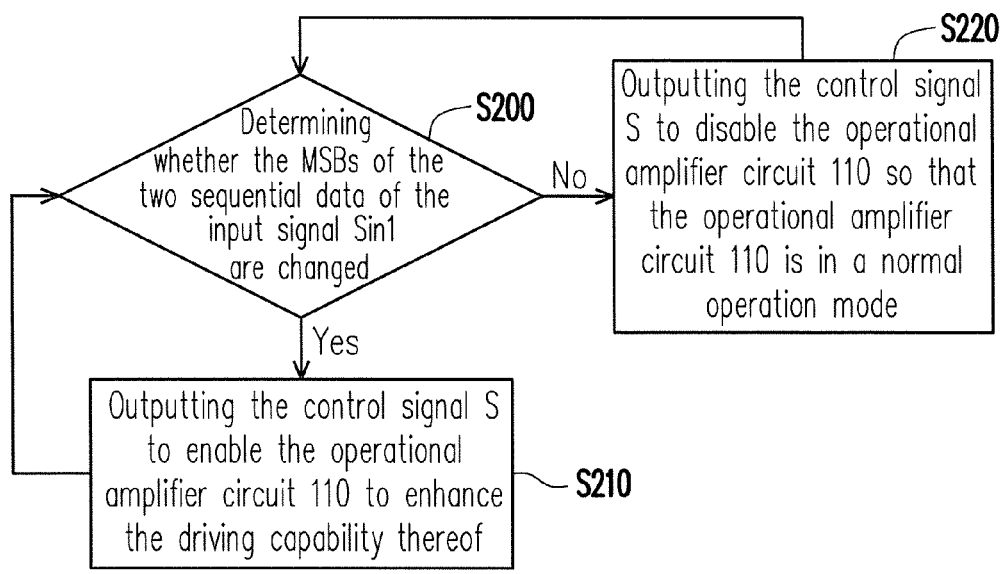
FIG. 2 is a flowchart illustrating a method of enhancing driving capability of the operational amplifier circuit according to an embodiment of the invention.

FIG. 2 is a flowchart illustrating a method of enhancing driving capability of the operational amplifier circuit according to an embodiment of the invention. Referring to FIG. 2 with FIG. 1, in step S200, the comparator circuit 120 firstly determines whether the MSBs of the two sequential data of the input signal Sin1 are changed. In the present embodiment, the MSBs of the two sequential data of the input signal Sin1 are changed from 0 to 1 or from 1 to 0, alternatively. Thus, once the comparator circuit 120 detects that the MSB of the input signal Sin1 is changed, step S210 in the method is performed. In step S210, the comparator circuit 120 outputs the control signal S to enable the operational amplifier circuit 110 to enhance the driving capability thereof. Then, step S200 in the method is returned to continuously determine whether the MSBs of the two sequential data of the input signal Sin1 are changed is continuously determined.

On the other hand, in step S200, if the comparator circuit 120 determines that the MSBs of the two sequential data of the input signal Sin1 are not changed, step S220 in the method is performed. In step S220, the comparator circuit 120 outputs the control signal S to disable the operational amplifier circuit 110, which is also referred to as the disable control signal S. At this time, the MSB of the input signal Sin1 is not changed, and thus, the operational amplifier circuit 110 is in a normal operation mode, and any adjustment of the driving capability thereof is not required. Then, step S200 in the method is returned to continuously determine whether the MSBs of the two sequential data of the input signal Sin1 are changed.

To be in brief, the method is utilized to firstly determine whether the MSB of the data at the input terminal of the operational amplifier module 100 is changed. If no, the operation of the driving capability enhancement is not performed, while if yes, the control signal S is transmitted to enable the operational amplifier circuit 110 to enhance the driving capability thereof. In addition, even though the comparator circuit 120 is configured to determine the MSB of the input signal Sin1 in the present embodiment, the invention is not limited thereto. In other embodiments, the comparator circuit 120 may be configured to determine whether the input signal Sin1 is changed based on any one bit of the two sequential data of the input signal Sin1.

Figure 3:
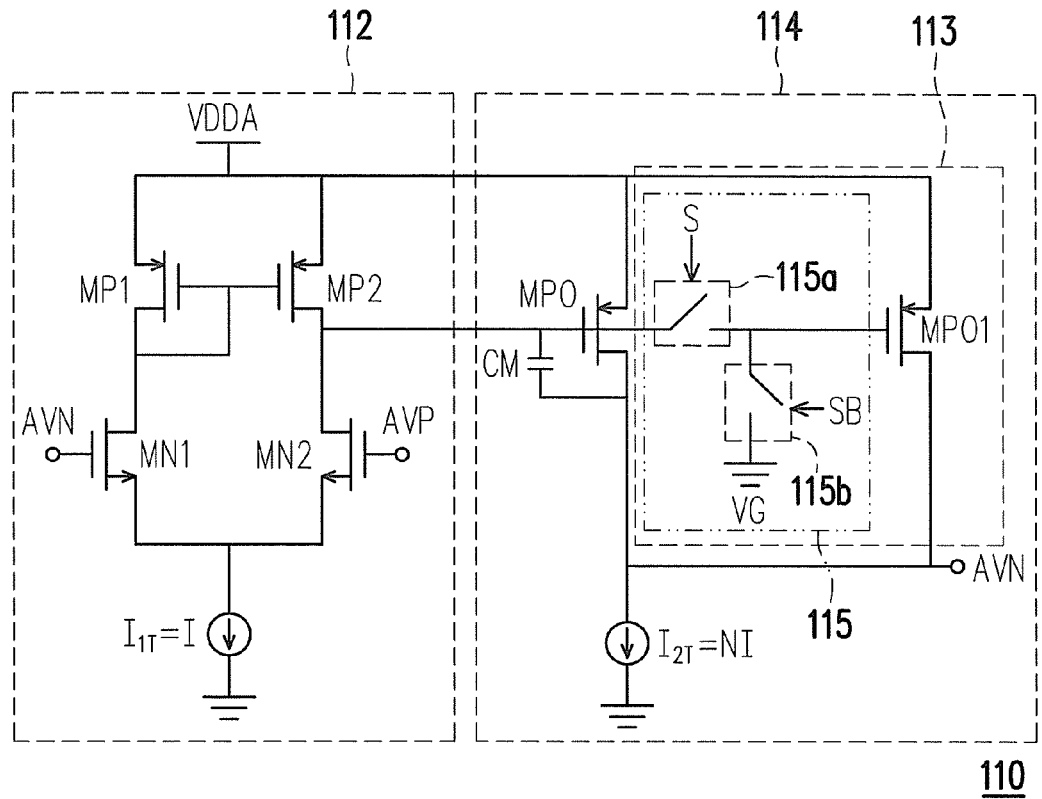
FIG. 3 is a schematic diagram illustrating the internal circuit of the operational amplifier circuit in FIG. 1.

FIG. 3 is a schematic diagram illustrating the internal circuit of the operational amplifier circuit in FIG. 1. Referring FIG. 3 with FIG. 1, the operational amplifier circuit 110 of the present embodiment includes an input stage circuit 112 and an output stage circuit 114. The input stage circuit 112 is configured to receive differential input signals AVN and AVP. The differential input signals AVN and AVP referred to herein correspond to the analog input signal Sin2 in FIG. 1. The output stage circuit 114 is coupled to the input stage circuit 112 and configured to enhance the driving capability of the analog input signal Sin2.

Furthermore, the output stage circuit 114 of the present embodiment includes a driving capability control circuit 113 and a first output transistor MPO. The driving capability control circuit 113 includes a second output transistor MPO1 and a switch module 115. In the present embodiment, the second output transistor MPO1 and the first output transistor MPO are coupled in parallel and samely biased by a current source $I_{2T}$. The value of the current source $I_{2T}$ is N times a current source $I_{1T}$ of the input stage circuit 112. The switch module 115 is coupled between a gate of the first output transistor MPO and a gate of the second output transistor MPO1 and controlled by the control signal S. In detail, the switch module 115 includes a first switch transistor 115a and a second switch transistor 115b. The first switch transistor 115a is coupled between the gate of the first output transistor MPO and the gate of the second output transistor MPO1 and controlled by the control signal S. The second switch transistor MPO1 is coupled between the gate of the second output transistor MPO1 and a specific voltage VG and controlled by the inverted control signal (hereinafter, the reversed control signal SB). The specific voltage VG herein is, for example, a ground voltage, but the invention is not limited thereto.

Figure 4:
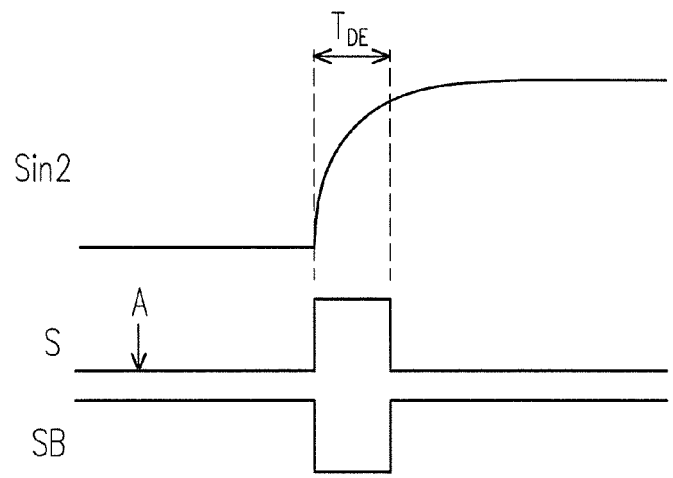
FIG. 4 is a schematic diagram of the waveforms of an input signal, a control signal and the inverted control signal according to an embodiment of the invention.

From the perspective of circuit operation, FIG. 4 is a schematic diagram of the waveforms of an input signal, a control signal and the inverted control signal according to an embodiment of the invention. Referring FIG. 4 with FIG. 3, when determining that the driving capability enhancement of the operational amplifier circuit 110 is required, the comparator circuit 120 outputs the control signal S to enable the switch module 115. During the switch module 115 being enabled, i.e. during a time period $T_{DE}$, the control signal S is in a high-level state, while the reversed control signal SB is in a low-level state. At this time, the first switch transistor 115a is turned off, and the second switch transistor 115b is turned on. The gate of the second output transistor MPO1 is coupled to the specific voltage VG. Thus, the gate of the second output transistor MPO1 may be dropped down to the ground voltage while the second switch transistor 115b is turned on, such that a greatest voltage-drop occurs between the source and the gate of the second output transistor MPO1. Accordingly, a value of an equivalent resistance of the second output transistor MPO1 becomes smaller due to the voltage difference so as to achieve the driving capability enhancement of the operational amplifier circuit 110. The aforementioned feature is presented in the waveform of the input signal illustrated in FIG. 4. In FIG. 4, during the time period $T_{DE}$, the equivalent resistance of the second output transistor MPO1 is very small so that a speed of charging the input signal Sin2 up to a target voltage is increased, the length of the time period $T_{DE}$ is shortened, and the driving capability of the operational amplifier circuit 110 is enhanced.

In other words, in the present embodiment, the enable control signal S has a high voltage level for enabling the driving capability control circuit 113 to operate the driving capability enhancement on the operational amplifier circuit 110. In other embodiments, the enable control signal S may have a low voltage level according to different implementation manners of the switch module 115, and the invention is not limited thereto. Besides, in the present embodiment, the driving capability enhancement of the operational amplifier circuit 110 may be, for example, increasing the speed of charging the input signal Sin2 up to the target voltage and shortening the length of the time period $T_{DE}$.

On the other hand, when determining that the driving capability enhancement of the operational amplifier circuit 110 is not required, the comparator circuit 120 outputs the control signal S to disable the switch module 115. At this time, the control signal S is in a low-level state, while the reversed control signal SB is in a high-level state. Thus, the first switch transistor 115a is turned on, and the second switch transistor 115b is turned off. The gate of the second output transistor MPO1 is coupled to the gate of the first output transistor MPO, instead of the ground voltage, so that the two gates are presented as a parallel coupling state and operated similarly to those in the output transistors of the normal type output stage circuit.

Namely, in the present embodiment, the disable control signal S has a low voltage level for enabling the output stage circuit 114 to be in the normal operation mode, i.e. the output transistors are presented as the parallel coupling state. In other embodiment, the disable control signal S may have a high voltage level according to different implementation manners of the switch module 115, and the invention is not limited thereto.

To sum up, the control signal S may decide whether the gate of the second output transistor MPO1 is coupled to the gate of the first output transistor MPO. When the driving capability enhancement of the operational amplifier circuit 110 is not required, the first output transistor MPO and the second output transistor MPO1 are coupled in parallel, of which the operation mode is similar to the output transistors of the normal type output stage circuit. When the driving capability enhancement of the operational amplifier circuit 110 is required, the gate of the second output transistor MPO1 may be dropped down to the ground voltage or a lower voltage so as to increase the speed of charging the input signal Sin2 up to the target voltage.

Moreover, in the present embodiment, there may be a time delay between the time point for the comparator circuit 120 outputting the enable control signal S and the time point detecting that the input signal Sin1 is changed. For instance, in the present embodiment, the comparator circuit 120 detects that the input signal Sin1 is changed at a time point A, and the comparator circuit 120 delays until the initial time of the time period $T_{DE}$ and starts to output the control signal S in the high-level state, between which there is a time delay. In the present embodiment, the time to start the high-level control signal S is decided by using a clock timer or based on a fixed time pre-determined by the designer.

In addition, from the perspective of the circuit layout, the first output transistor MPO and the second output transistor MPO1 are implemented by adopting a layout using one or more transistors. For example, the first output transistor MPO is implemented by adopting a layout using M transistors, while the second output transistor MPO1 is implemented by adopting a layout using N transistors, wherein M≥0 and N>1. Therefore, in the present embodiment, the second output transistor MPO1 is implemented by additionally configuring N transistors on the chip, or alternatively, the second output transistor MPO1 is configured by selecting N transistors from the M transistors of the first output transistor MPO, wherein M>N.

Besides, in the present embodiment, the gate of second output transistor MPO1 is dropped down to the ground voltage or lower a lower voltage, but the invention is not limited thereto. In other embodiments, the specific voltage that is coupled to the gate of the second output transistor may also be a system voltage VDDA.

Figure 5:
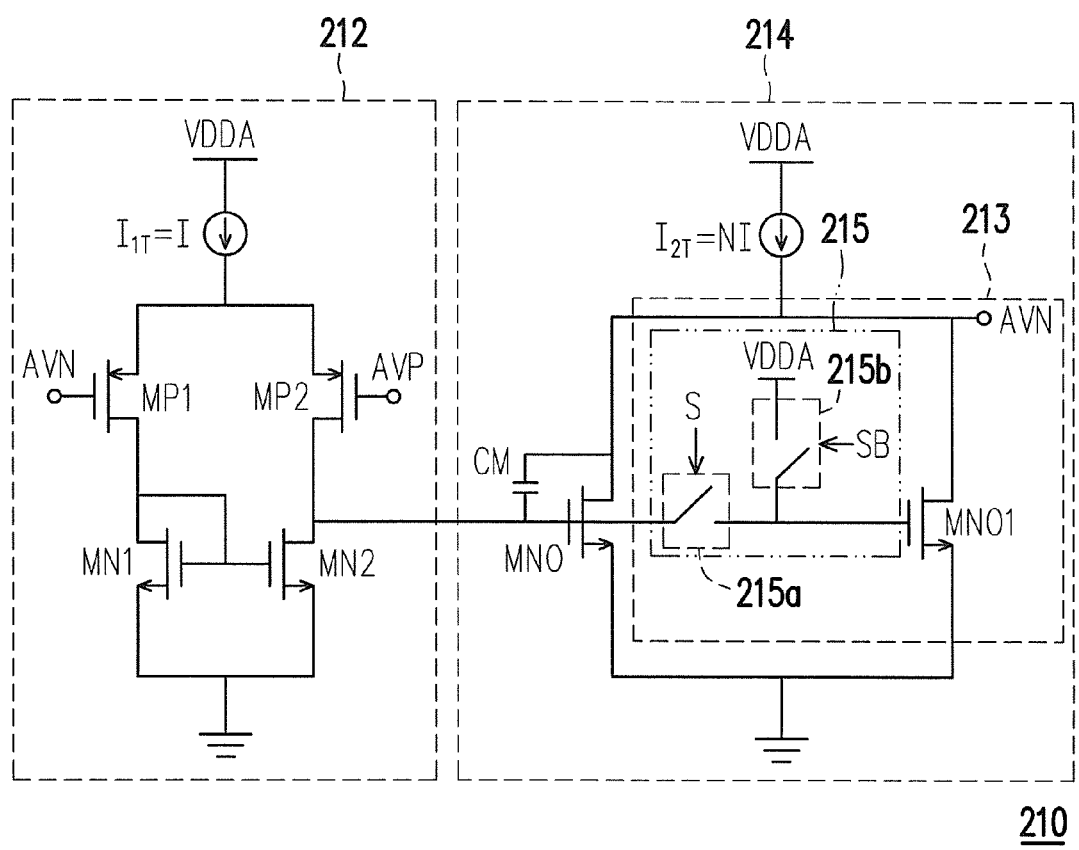
FIG. 5 is a schematic diagram illustrating the internal circuit of the operational amplifier circuit according to another embodiment of the invention.

FIG. 5 is a schematic diagram illustrating the internal circuit of the operational amplifier circuit according to another embodiment of the invention. Referring to FIG. 5 with FIG. 3, an operational amplifier circuit 210 of the present embodiment is similar to the operational amplifier circuit 110 illustrated in FIG. 3, and the main difference therebetween is that the specific voltage coupled to the gate of the second output transistor MNO1 is a system voltage VDDA, and the detail thereof is described hereinafter.

In the present embodiment, the transistor type adopted in the operational amplifier circuit 210 is different from what is adopted in the operational amplifier circuit 110. For example, in the operational amplifier circuit 210, a differential input of the input stage circuit 212 is implemented by adopting P-type transistors MP1 and MP2, while current mirrors MN1 and MN2 of the input stage circuit 212 and the first output transistor MNO and the second output transistor MNO1 of the output stage circuit 214 are implemented by adopting N-type transistors, as shown in FIG. 5. Oppositely, in the operational amplifier circuit 110, the differential input of the input stage circuit 112 is implemented by adopting N-type transistors MN1 and MN2, while current mirrors MP1 and MP2 of the input stage circuit 112 and the first output transistor MNO and the second output transistor MNO1 of the output stage of the output stage circuit 114 are implemented by adopting P-type transistors, as shown in FIG. 3.

The coupling relationship between each element in the operational amplifier circuit 210 varies with different implementation manners adopting different types of transistors, as illustrated in FIG. 5, and will not be repeated hereinafter. Herein, the first output transistor MNO and the second output transistor MNO1 of the output stage circuit 214 are implemented by adopting N-type transistors, and thus, when the driving capability enhancement of the operational amplifier circuit 210 is required, a second switch transistor 215b of a switch module 215 is turned on, and the gate of the second output transistor MNO1 is raised up to the system voltage VDDA so as to increase the speed of charging the input signal Sin2 up to the target voltage.

Based on the above, in the embodiments of the invention, the comparator circuit determines whether the signal inputted to the operational amplifier module is changed so as to decide whether to output the enable control signal to the driving capability control circuit. During the control signal being enabled, the driving capability control circuit drops down the equivalent resistance of the output transistor by using the voltage in the specific level so as to enhance the driving capability of the operational amplifier circuit.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. An operational amplifier module, comprising:
    an operational amplifier circuit, comprising:
        an input stage circuit, configured to receive an input signal in analog format; and
        an output stage circuit, coupled to the input stage circuit and configured to enhance driving capability of the input signal in analog format; and
    a comparator circuit, coupled to the output stage circuit and configured to receive an input signal in digital format and determine whether the input signal in digital format is changed so as to output a control signal to enable the output stage circuit to enhance the driving capability of the operational amplifier circuit.

2. The operational amplifier module according to claim 1, wherein the output stage circuit comprises:
    a driving capability control circuit, coupled to the comparator circuit, controlled by the control signal and configured to enhance the driving capability of the operational amplifier circuit by using a specific voltage during the control signal being enabled.

3. The operational amplifier module according to claim 2, wherein the specific voltage is a system voltage or a ground voltage.

4. The operational amplifier module according to claim 2, wherein the output stage circuit further comprises a first output transistor, and the driving capability control circuit comprises:
    a second output transistor, connected with the first output transistor in parallel; and
    a switch module, coupled between a gate of the first output transistor and a gate of the second output transistor and controlled by the control signal,
    wherein during the control signal being enabled, the switch module enhances the driving capability of the operational amplifier circuit by using the specific voltage.

5. The operational amplifier module according to claim 4, wherein the switch module comprises:
    a first switch transistor, coupled between the gate of the first output transistor and the gate of the second output transistor and controlled by the control signal; and
    a second switch transistor, coupled between the gate of the second output transistor and the specific voltage and controlled the inverted control signal,
    wherein when the first switch transistor is turned off, the second switch transistor is turned on so that the gate of the second output transistor is coupled to the specific voltage.

6. The operational amplifier module according to claim 2, wherein the comparator circuit determines whether a voltage value or a current value of the input signal in digital format is changed, if yes, the comparator circuit outputs the control signal to enable the driving capability control circuit, and if no, the comparator circuit outputs the control signal to disable the driving capability control circuit.

7. The operational amplifier module according to claim 2, further comprising:
    a digital-to-analog converter circuit, coupled to the operational amplifier circuit and the comparator circuit and configured to receive the input signal in digital format, convert the input signal in digital format to the input signal in analog format, and output the input signal in analog format to the operational amplifier circuit,
    wherein the comparator circuit determines whether a most significant bit (MSB) of the input signal in digital format is changed, if yes, the comparator circuit outputs the control signal to enable the driving capability control circuit, and if no, the comparator circuit outputs the control signal to disable the driving capability control circuit.

8. A method of enhancing driving capability of an operational amplifier circuit, wherein the operational amplifier circuit comprises an output stage circuit, the method comprising:

receiving an input signal in digital format;

determining whether the input signal in digital format is changed;

if the input signal in digital format is changed, outputting a control signal to enable the output stage circuit so as to enhance the driving capability of the operational amplifier circuit.

9. The method of enhancing the driving capability of the operational amplifier circuit according to claim 8, further comprising:

during the control signal being enabled, enhancing the driving capability of the operational amplifier circuit by using a specific voltage.

10. The method of enhancing the driving capability of the operational amplifier circuit according to claim 8, further comprising:

if the input signal in digital format is not changed, outputting the control signal to disable the output stage circuit.

11. The method of enhancing the driving capability of the operational amplifier circuit according to claim 9, wherein the specific voltage is a system voltage or a ground voltage.

12. The method of enhancing the driving capability of the operational amplifier circuit according to claim 8, wherein the step of determining whether the input signal in digital format is changed comprises:

determining a voltage value or a current value of the input signal in digital format is changed.

13. The method of enhancing the driving capability of the operational amplifier circuit according to claim 8, wherein the step of determining whether the input signal in digital format is changed comprises:

determining whether a most significant bit (MSB) of the input signal in digital format is changed.

* * * * *